United States Patent
Gornstein et al.

(10) Patent No.: US 6,396,548 B1
(45) Date of Patent: May 28, 2002

(54) SYSTEM AND METHOD FOR MULTIMODE OPERATION OF A DIGITAL FILTER WITH SHARED RESOURCES

(75) Inventors: Viktor Gornstein, New York; Gennady Turkenich, Hillsdale; Patrick D. Kelliher, Tarrytown, all of NY (US)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/430,537

(22) Filed: Oct. 29, 1999

(51) Int. Cl.[7] .......................... H04N 5/44; H04N 5/445; H03K 5/159; H04B 1/10; G06F 17/10; G06F 17/17; H03H 5/00

(52) U.S. Cl. ...................... 348/725; 348/726; 348/614; 348/727; 348/553; 348/555; 348/558; 375/232; 375/233; 375/350; 708/313; 708/319; 708/322; 708/323; 333/18

(58) Field of Search ................................ 348/725, 726, 348/727, 614, 571, 721, 553–558; 375/350, 232, 235; 708/313, 316, 319, 322–23; 333/18, 28 R; H04N 5/445

(56) References Cited

U.S. PATENT DOCUMENTS

| | | | | |
|---|---|---|---|---|
| 4,422,175 A | * | 12/1983 | Bingham et al. | 375/232 |
| 5,222,035 A | * | 6/1993 | Nakase et al. | 708/319 |
| 5,345,273 A | * | 9/1994 | Sun | 348/607 |
| 5,479,454 A | * | 12/1995 | Greggain et al. | 375/350 |
| 5,663,773 A | * | 9/1997 | Goeckler | 348/726 |
| 5,831,880 A | * | 11/1998 | Lee | 708/319 |
| 5,886,749 A | * | 3/1999 | Williams et al. | 348/614 |
| 5,898,731 A | * | 4/1999 | Kwak | 375/320 |
| 5,912,827 A | * | 6/1999 | Sasaki | 708/319 |
| 6,035,312 A | * | 3/2000 | Hasegawa | 708/322 |

* cited by examiner

*Primary Examiner*—John W. Miller
*Assistant Examiner*—Paulos M. Natnael
(74) *Attorney, Agent, or Firm*—Russell Gross

(57) ABSTRACT

There is disclosed a digital filter cell capable of processing in a first mode a first signal having real data components only and processing in a second mode a second signal having real data components and imaginary data components. The digital filter cell comprises: 1) a plurality of serially coupled coefficient registers for receiving a sequence of coefficients; 2) a plurality of serially coupled data registers for receiving a sequence of digital data samples, each register having a tap output; 3) a data multiplexer having a plurality of input channels for receiving the tap outputs from the plurality of serially coupled data registers; and 4) a product summation circuit having a first input coupled to an output of the data multiplexer and a second input coupled to an output of a selected one of the plurality of serially coupled coefficient registers. The product summation circuit generates a summation of a plurality of products formed by sequentially multiplying each coefficient received from the selected coefficient register by a corresponding digital data sample received from a selected one of the plurality of serially coupled data registers. The product summation circuit adds each of the plurality of products to the summation when the digital filter cell is operating in the first mode. In the second mode, the product summation circuit selectively adds ones of the plurality of products to the summation or selectively subtracts ones of the plurality of products from the summation.

29 Claims, 6 Drawing Sheets

SYSTEM AND METHOD FOR MULTIMODE OPERATION OF A DIGITAL FILTER WITH SHARED RESOURCES

TECHNICAL FIELD OF THE INVENTION

The present invention is directed, in general, to digital filters capable of resource sharing, and, more specifically, to a digital filter capable of adapting filter cells according to the standard of the received signal.

BACKGROUND OF THE INVENTION

Modern communication devices, including both wireless and wireline devices, often rely on advanced digital signal processing technology to receive and demodulate digital signals that are transmitted through, and distorted by, a dispersive channel, such as the atmosphere or cabling. An important component in many of these communication devices is the digital filter. Conventional digital filters are comprised of a series arrangement of delay elements, or taps, into which a series of digital samples are fed. Each tap contains a data register that holds a data sample, a coefficient register that stores a coefficient, and a multiplier that multiplies the data sample by the coefficient. The outputs of all of the multipliers are then added together in a summation circuit to form the filter output. Thus, digital filters are based on a filter core that is implemented by multiple replications and daisy chaining of the same basic filter cell.

Different types of filters are used for different types of digital signals, usually because of the need for a different number of filter cells. Thus, the structure of a digital filter used to filter quadrature amplitude modulated (QAM) signals, such as a 64 QAM signal, is different than the structure of a digital filter used to filter a pulse amplitude modulated (PAM) signal, such as an eight vestigial side band (8 VSB) signal. In general, as the complexity of the function performed by a digital filter increases, so too does the number of cells in the digital filter increase. The corresponding increase in the size of the filter becomes a severe disadvantage in integrated circuits or other systems in which the space available is limited.

To reduce the size of digital filters that employ a large number of cells, resource-sharing techniques are frequently used. Typically, resource sharing is implemented by using the same multiplier to multiply the data samples and coefficients from different taps. Since multipliers are frequently the largest component found in filter cells, sharing a multiplier among a plurality of taps greatly reduces the size of a digital filter. When a filter cell is implemented with resource sharing for multiple taps, it operates with a clock frequency that is multiple times higher than the data sampling frequency at the filter input.

There is still much room for improvement, however, with respect to resource sharing. This is particularly true in multimode digital filters that are capable of operating in different modes to filter signals of different modulation types, such as 64 QAM and 8 VSB signals. In a 64 QAM mode, the digital signal samples at the filter input and the filter coefficients are complex values consisting of real and imaginary components. In an 8VSB mode, the digital signal samples at the filter input and the filter coefficients are real values, but the symbol rate is twice as high for the same channel capacity and bandwidth utilization. Conventional multimode filters are implemented with separate circuitry for each mode, with little, if any, resource sharing.

There is therefore a need in the art for improved digital filter designs. In particular, there is a need in the art for digital filter designs that implement resource sharing to the greatest extent possible. More particularly, there is a need for improved multimode digital filters that implement resource sharing in the circuitry used for each mode of the digital filter.

SUMMARY OF THE INVENTION

To address the above-discussed deficiencies of the prior art, it is a primary object of the present invention to provide, for use in a digital filter, a digital filter cell capable of processing in a first mode a first signal having real data components only and processing in a second mode a second signal having real data components and imaginary data components. In an advantageous embodiment of the present invention, the digital filter cell comprises: 1) a plurality of serially coupled coefficient registers capable of receiving a sequence of coefficients; 2) a plurality of serially coupled data registers capable of receiving a sequence of digital data samples, each of the serially coupled data registers having a tap output; 3) a data multiplexer having a plurality of input channels, each of the input channels capable of receiving the tap output from each of the plurality of serially coupled data registers; and 4) a product summation circuit having a first input coupled to an output of the data multiplexer and a second input coupled to an output of a selected one of the plurality of serially coupled coefficient registers, wherein the product summation circuit is capable of generating a summation of a plurality of products formed by sequentially multiplying each coefficient received from the selected coefficient register by a corresponding digital data sample received from a selected one of the plurality of serially coupled data registers, wherein the product summation circuit adds each of the plurality of products to the summation when the digital filter cell is operating in the first mode and wherein the product summation circuit one of 1) selectively adds ones of the plurality of products to the summation and 2) selectively subtracts ones of the plurality of products from the summation when the digital filter cell is operating in the second mode.

According to one embodiment of the present invention, the product summation circuit comprises a conditional minus one multiplier capable of selectively inverting a value of a data sample received from the data multiplexer, a multiplier, an adder and an accumulator register.

According to another embodiment of the present invention, the product summation circuit comprises a multiplier, an adder-subtractor, and an accumulator register.

According to still another embodiment of the present invention, the first mode comprises an eight vestigial side band (8 VSB) mode of operation.

According to yet another embodiment of the present invention, the second mode of operation comprises a quadrature amplitude modulation (QAM) mode of operation.

According to a further embodiment of the present invention, the real data in the first mode are sampled at a frequency of 2F and the real data components and imaginary data components in the second data mode are sampled at a frequency of F.

According to a still further embodiment of the present invention, the digital filter is adaptive and the coefficients are modifiable.

According to a yet further embodiment of the present invention, the digital filter cell further comprises a coefficient update circuit having a first input coupled to an output of a first selected one of the plurality of serially coupled coefficient registers, a second input coupled to a second digital filter cell in the digital filter, and an output coupled to an input of a second selected one of the plurality of serially coupled coefficient registers.

The foregoing has outlined rather broadly the features and technical advantages of the present invention so that those skilled in the art may better understand THE DETAILED DESCRIPTION OF THE INVENTION that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms "include" and "comprise" and derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller," "processor," or "apparatus" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged digital filter.

Those skilled in the art will readily understand that while the embodiment of the present invention described below is principally oriented towards an adaptive digital filter implemented in a television receiver, this is by way of illustration only. In fact, the improved digital filter described below may be readily adapted for use in connection with any digital receiver implementing a digital signal processing circuit, including modems and telecommunication networks.

Figure 1:
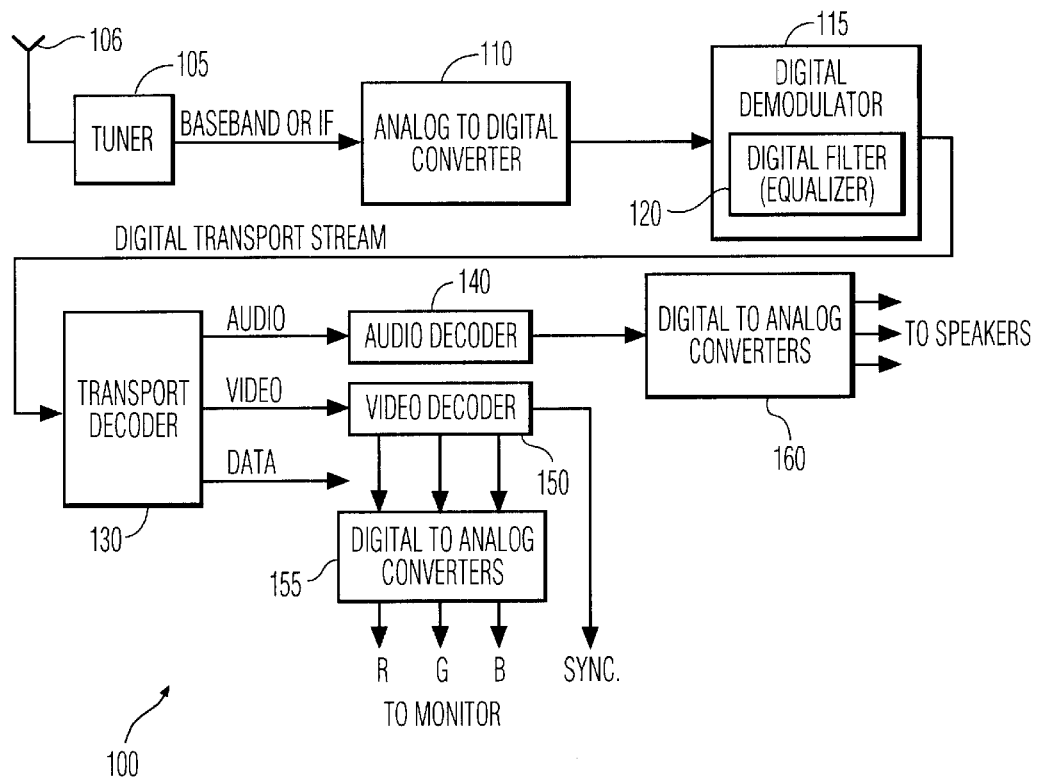
FIG. 1 illustrates an exemplary television set incorporating a multimode digital filter in accordance with one embodiment of the present invention.

FIG. 1 illustrates exemplary digital television 100 incorporating multimode digital filter 120 in accordance with one embodiment of the present invention. Digital television 100 comprises tuner 105, which tunes and amplifies digital signals received from antenna 106 in at least two modes, namely quadrature amplitude modulated (QAM) signals, such as a 64 QAM signal, and pulse amplitude modulated (PAM) signals, such as an 8 VSB signal. The output of tuner 105 may be either a baseband or an intermediate frequency (IF) signal, which is converted to digital samples by analog-to-digital converter (ADC) 110. At this point, the digital values represent a sequence of symbols, where each symbol represents X-bits of binary data. The digital samples then undergo digital demodulation in digital demodulator 115, which includes digital filter 120 (i.e., an equalizer). Digital filter 120, explained below in greater detail in FIGS. 5 and 6, reduces the number of errors in symbol reception caused by a variety of types of sources, including, intersymbol distortion, selective fading, co-channel interference, neighbor channel interference, noise, and the like.

The demodulated output of digital demodulator 115 comprises a digital transport stream that is sent to transport decoder 130. Transport decoder 130 decodes the digital transport stream into its constituent components, namely audio, video, and data streams. Audio decoder 140 and digital-to-analog converters 160 convert the stream of audio data to an analog signal that is sent to speakers. Video decoder 150 and digital-to-analog converters 155 convert the stream of video data to, for example, RGB video signals and sync signals that are sent to a monitor.

Figure 2:
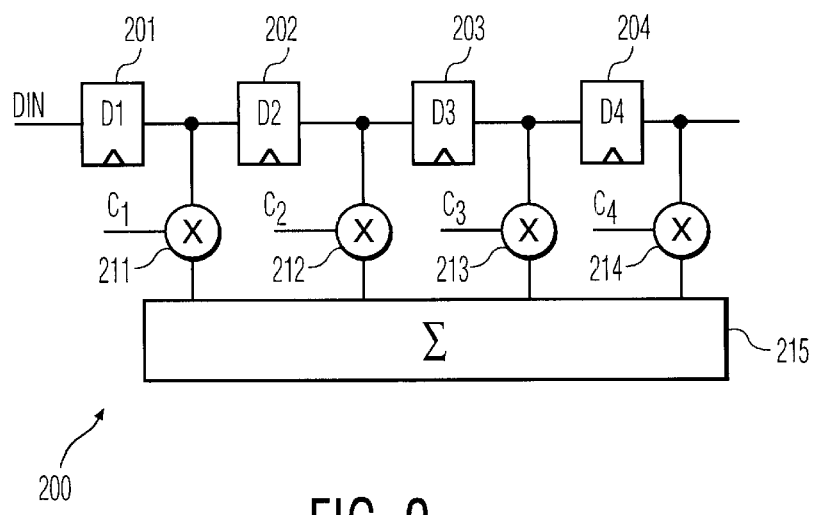
FIG. 2 illustrates a high-level block diagram of an exemplary four tap digital filter.

FIG. 2 illustrates a high-level block diagram of a conventional four tap digital filter 200. Digital filter 200 comprises data registers 201–204, labeled D1 through D4, respectively, and multipliers 211–214. The data register chain receives a series of input digital samples, labeled DIN. Thus the content of data registers 201–204 are consecutive samples of the same signal, each time shifted by one period, T, of the sampling clock signal.

Multiplier 211 multiplies the output of data register 201 and coefficient C1. Multiplier 212 multiplies the output of data register 202 and coefficient C2. Multiplier 213 multiplies the output of data register 203 and coefficient C3. Finally, multiplier 214 multiplies the output of data register 204 and coefficient C4. Each multiplier and register form a filter cell (or tap). For example, register 201 and multiplier 211 form a filter cell. The outputs of all four cells are then added together in summation circuit 215. As is well known in the art, adaptive digital filter 200 can be used to reduce the number of errors in symbol reception by adjusting the values of coefficients C1–C4 according to a number of well-known algorithms, such as the least mean square (LMS) algorithm and others.

It is noted that adaptive digital filter 200 contains a multiplier in each filter cell. As explained above, it is highly desirable to reduce the amount of circuitry such as multipliers in a digital filter by means of resource sharing. It is particularly desirable to implement resource sharing in a multimode digital filter capable of processing signals in different modes, such as a 64 QAM signal mode and an 8 VSB signal mode.

It is a primary object of the present invention to introduce resource sharing in a multimode filter, with or without adaptation, that provides 2*k*m taps during real mode operations in which real data are sampled at a frequency of 2F, and that provides k*m complex taps during complex mode operations in which complex data are sampled at a frequency of F. In these formulas, k represents the number of cells in the filter and 2m represents a resource-sharing factor of a cell operating at a clock frequency equal to 4*m*F.

Figure 5:
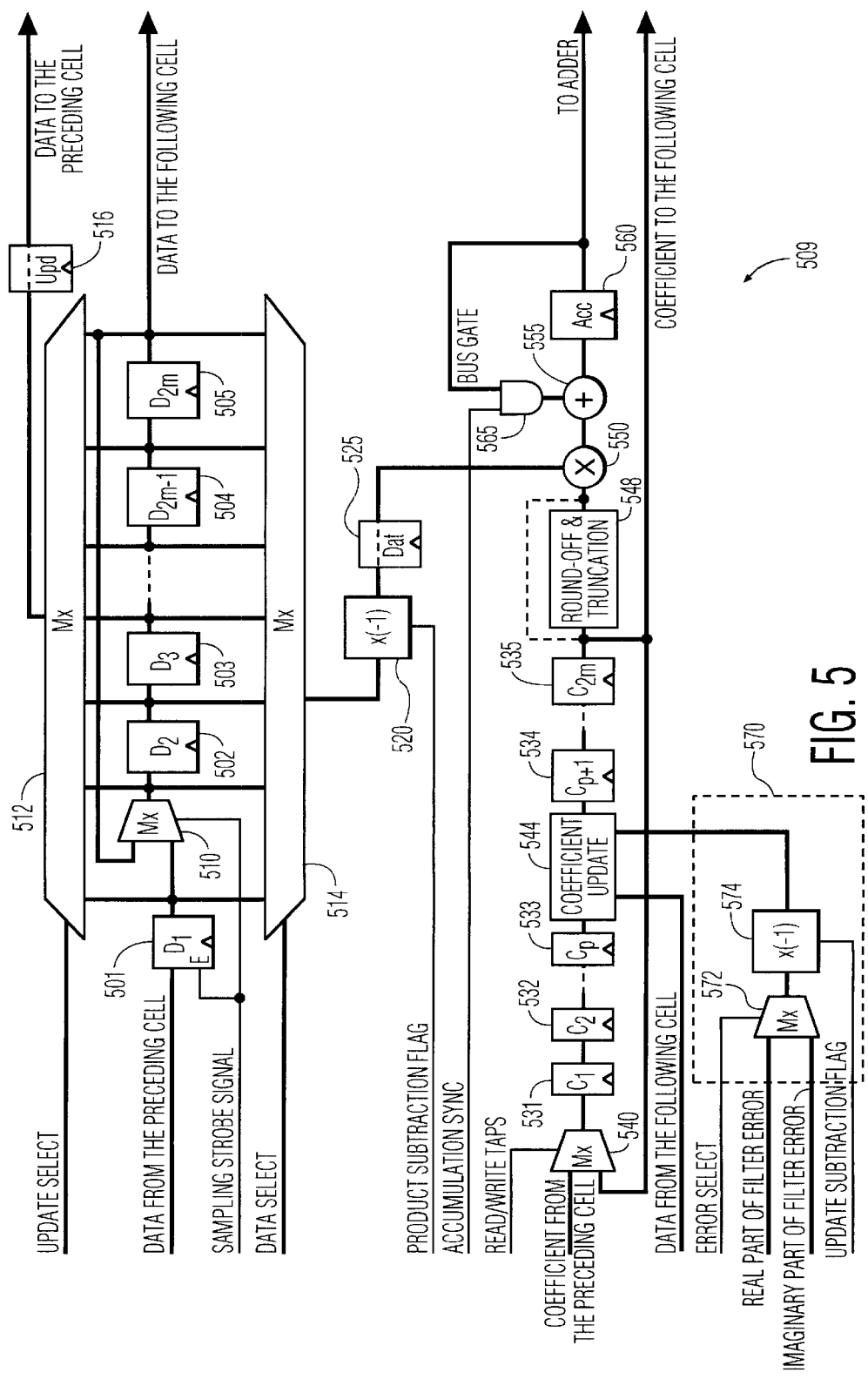
FIG. 5 illustrates a generalized schematic diagram of a multimode digital filter cell in accordance with one embodiment of the present invention.
Figure 6:
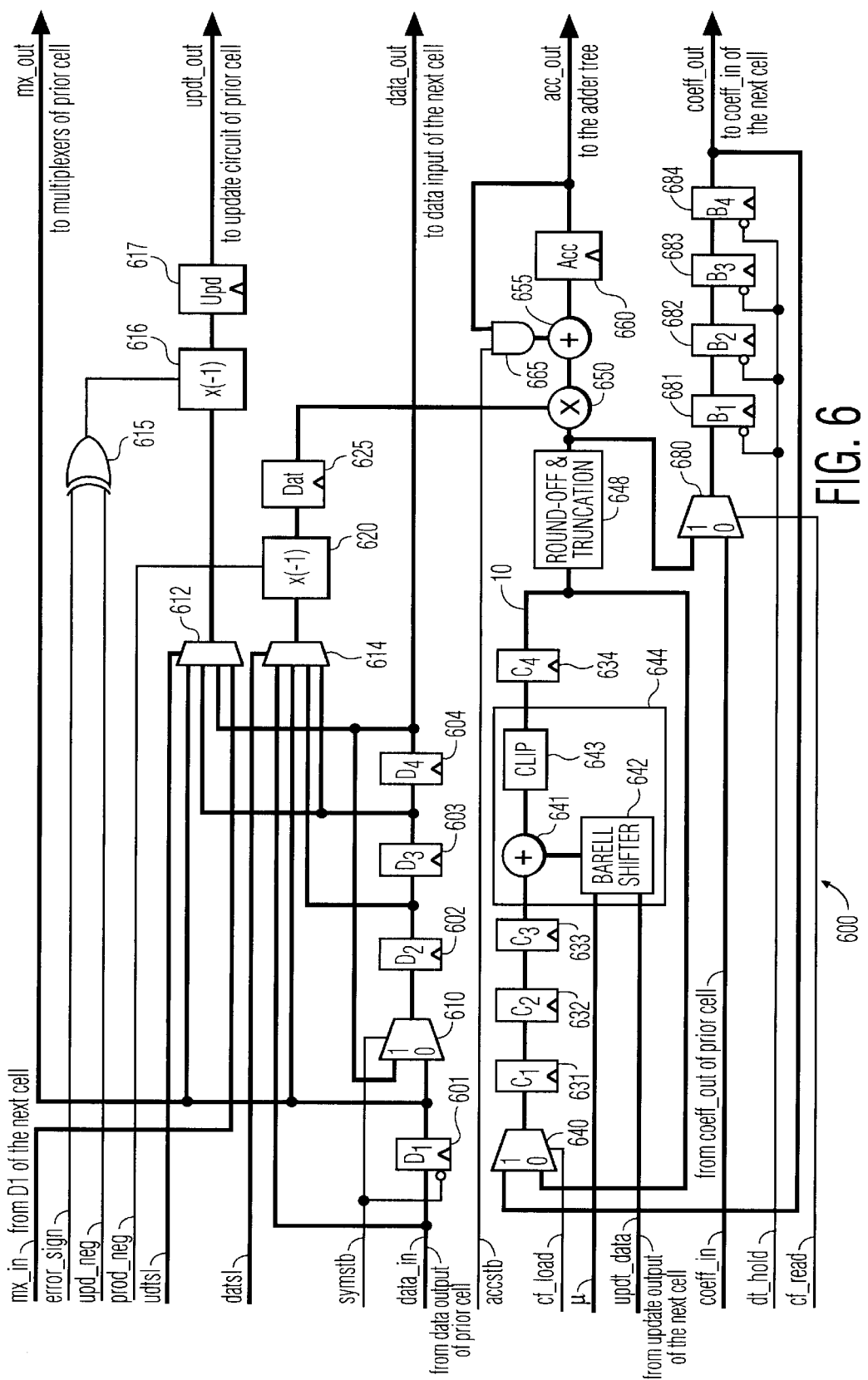
FIG. 6 illustrates a specific schematic diagram of a multimode digital filter cell in accordance with one embodiment of the present invention.

Before describing the present invention in greater detail, two special purpose circuits used in the present invention are first described, in order to simplify the explanation of the embodiments illustrated in FIGS. 5 and 6.

Figure 3:
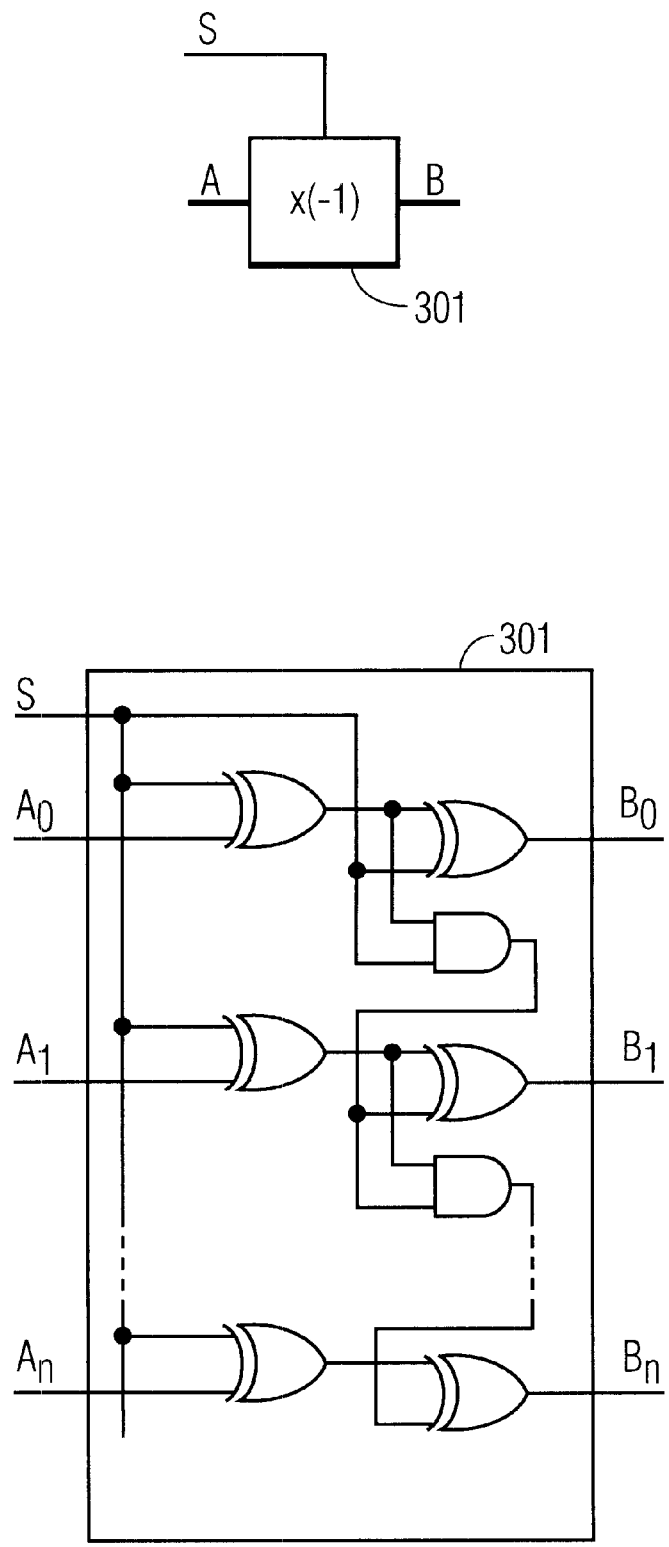
FIG. 3 illustrates an exemplary conditional minus one multiplier implemented in a multimode digital filter in accordance with one embodiment of the present invention.

FIG. 3 illustrates exemplary conditional minus one multiplier 301, which is implemented in multimode digital filter 120 in accordance with one embodiment of the present invention. Conditional minus one multiplier 301 is used to selectively multiply by minus one a value received from a data bus. The bus line input, A, shown as a thick bold line, is an N-bit bus comprising bits A0, A1, A2, . . . , An. If selection signal S=0, the output, B, of conditional minus one multiplier 301 is equal to input A (i.e., B=A). If selection signal S=1, the value on input A is multiplied by minus one on output B (i.e., B=−A). Elements 520 and 574 in FIG. 5 are implemented in accordance with conditional minus one multiplier 301. Elements 616 and 620 in FIG. 6 are implemented in accordance with conditional minus one multiplier 301.

Figure 4:
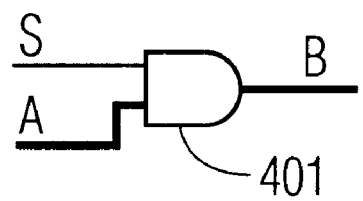
FIG. 4 illustrates an exemplary bus AND gate implemented in a multimode digital filter in accordance with one embodiment of the present invention.
Figure 4:
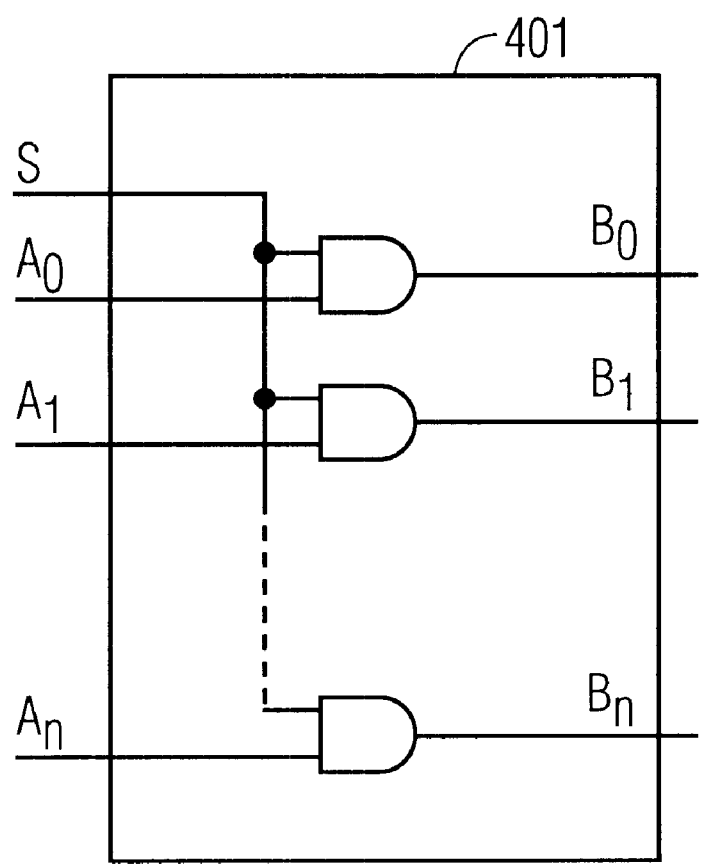

FIG. 4 illustrates exemplary bus AND gate 401 implemented in multimode digital filter 120 in accordance with one embodiment of the present invention. Bus AND gate 401 is used to selectively output a multi-bit value received from a data bus. The bus line input, A, shown as a thick bold line, is an N-bit bus comprising bits A0, A1, A2, . . . , An. If selection signal S=0, all of the bits of the output, B, of bus AND gate 401 are equal to 0 (i.e., B=0). If selection signal S=1, each of the bits on input A appear on output B (i.e., B=A). Element 565 in FIG. 5 is implemented in accordance with bus AND gate 401. Element 665 in FIG. 6 is implemented in accordance with bus AND gate 401.

FIG. 5 illustrates a general schematic diagram of exemplary filter cell 500 in multimode digital filter 120 in accordance with one embodiment of the present invention. Multimode digital filter 120 may be implemented with adaptation of coefficients. Among various algorithms, LMS adaptation can be used. Exemplary filter cell 500 includes 2m data registers, $D_1$ to $D_{2m}$, including exemplary data registers 501–505, and 2m coefficient registers, $C_1$ to $C_{2m}$, including exemplary coefficient registers 531–535. One input of multiplexer 510 is used to feed back the data values in the 2m data registers to data register 502, the second register in the chain. The other input of multiplexer 510 is fed by data register 501, which receives data from a preceding cell under control of Sampling Strobe signal.

Exemplary filter cell 500 also comprises data multiplexer 514 and update multiplexer 512. The signal Update Select is applied to update multiplexer 512 to selectively apply the output of one of the 2m data registers to update register 516, which is connected to a preceding filter cell. The signal Data Select is applied to data multiplexer 514 to selectively apply the output of one of the 2m data registers to conditional minus one multiplier 520, which is connected to data register 525. The output of data register 525 is one input to multiplier 550.

One channel of multiplexer 540 applies the coefficient from the preceding cell to the chain of 2m coefficient registers. The other channel of multiplexer 540 feeds back the output of last coefficient register, 2m, to the first coefficient register, C1. Coefficient update circuit 544 uses an error value (possibly inverted), update data from a subsequent (or following) cell and an existing coefficient from coefficient register 533 to provide an updated coefficient to coefficient register 534. The error value (possibly inverted) is provided by circuit 570, which comprises multiplexer 572 and conditional minus one multiplier 574. Circuit 570 is a common component shared by all filter cells in digital filter 120.

The output of the chain of 2m coefficient registers is fed through round-off and truncation circuit 548. The output of round-off and truncation circuit 548 is the other input to multiplier 550. The multiplication of the data value provided by data register 525 by the coefficient value provided by round-off and truncation circuit 548 produces a product on the output of multiplier 550 that form one input to adder 555. The output of adder 555 is applied to accumulator register 560. The output of accumulator register 560 is fed back to the other input of adder 555 via bus AND gate 565. The operation of exemplary filter cell 500 may be more readily understood by reference to FIG. 6, which illustrates a filter cell of a specific size.

FIG. 6 illustrates exemplary filter cell 600 in multimode digital filter 120 in accordance with one embodiment of the present invention. Filter cell 600 is a four tap filter, such that the value m=2 in the generalized case of the exemplary filter 500 in FIG. 5. Exemplary filter cell 600 is implemented using signed LMS adaptation of the filter coefficients.

Exemplary filter cell 600 includes four (4) data registers 601–604, labeled D1–D4, and four (4) coefficient registers 631–634, labeled C1–C4. One input of multiplexer 610 is used to feed back the data values in data register 604 to data register 602, the second register in the chain. The other input of multiplexer 610 is fed by data register 601, which receives data from the preceding cell under control of a Symbol Strobe (SYMSTB) signal.

Exemplary filter cell 600 also comprises update multiplexer 612 and data multiplexer 614. The signal Update Select (UDTSL) is applied to update multiplexer 612 to selectively apply the outputs of data registers 601, 603, 604, and register 601 (i.e., register D1) of the next filter cell to update register 617, which is connected on its output to the update input of the preceding filter cell. Exclusive-OR gate 615 is a common component shared by all filter cells in digital filter 120. Conditional minus one multiplier 616, depending on the output of Exclusive-OR gate 615, either passes the output of update multiplexer 612 to update register 617 unchanged or multiplies the output of update multiplexer 612 by minus one (−1).

The signal Data Select (DATSL) is applied to data multiplexer 614 to selectively apply the outputs of data registers 601, 602, or 603 or the outputs of the preceding data cell (DATA IN) to conditional minus one multiplier 620, which is connected to data register 625. The output of data register 625 is one input to multiplier 650.

Non-destructive read/write buffer registers 681–684 allow coefficients to be read from and loaded into coefficient registers 631–634 via a control processor in digital demodulator 115 or elsewhere. Coefficients in coefficient registers 631–634 may be shifted into buffer registers 681–684 via multiplexer 680 and subsequently shifted out to the control microprocessor. Buffer registers 681–684 are daisy-chained together across all of the filter cells in digital filter 120 so that the control microprocessor can serially shift the coefficients into buffer registers 681–684. The coefficients may then be loaded from buffer registers 681–684 into coefficient registers 631–634 via multiplexer 640.

Coefficient update circuit 644 uses update data (UPDT_DATA) from a subsequent (or following) cell (this data already has been multiplied by ERROR_SIGN Exclusive-OR'ed with UPD_NEG signal), a $\mu$ value representing the feedback coefficient of the LMS update circuit, and the coefficient in coefficient register 633 to provide an updated coefficient to coefficient register 634. Coefficient update circuit 644 comprises adder 641, barrel shifter 642, and clip circuit 643.

The output of the chain of four (4) coefficient registers is fed through round-off and truncation circuit 648. The output of round-off and truncation circuit 648 is the other input to multiplier 650. The multiplication of the data value provided by data register 625 and the coefficient value provided by round-off and truncation circuit 648 produces a product on the output of multiplier 650 that forms one input to adder 655. The output of adder 655 is applied to accumulator register 660. The output of accumulator register 660 is fed back to the other input of adder 655 via bus AND gate 665.

In filter cell 600, the data input of multiplier 650 may be connected to conditional minus one multiplier 620 directly, or indirectly through additional register 625. Also, the update data (UPDT_OUT) may be connected to the appropriate update input (UPDT_DATA) of a preceding (or prior) cell either directly from update multiplexer 612 and conditional minus one multiplier 616, or indirectly through register 617.

Round-off and truncation circuit 640 is optionally used when the bus width of the second input of multiplier 650 is smaller than the bus width of coefficient registers 631–634. The coefficient adaptation algorithm in the complex mode of operation may require alternation of the sign of the real and imaginary parts of the filter error at the first input of Exclusive-OR gate 615. This may occur, for instance, in an advantageous embodiment of the present invention in which filter cell 600 is implemented using signed LMS adaptation algorithm.

In a preferred embodiment of the present invention, filter cell 600 is implemented using the least mean square (LMS) adaptation algorithm. The resource-sharing factor of a preferred embodiment filter cell 600 is represented by 2m=4. The LMS adaptation is simplified by truncating the filter error value down to a single sign bit at the cell input (signed LMS). The LMS feedback coefficient $\mu$ is represented by the binary logarithm of $\mu$ rounded to the nearest integer and increased by some integer constant r (to represent $\mu$ in the range $2^{-r}$–$2^{-r+N}$ by integer between 0 and N). This approximation allows the multiplier in the coefficient update circuit to be replaced by barrel shifter 614.

In the real mode of operation, filter cell 600 provides the function of four filter taps. If the number of the cell operation cycle is n, filter coefficients within a cycle are: $C_{4n}$, $C_{3n}$, $C_{2n}$, and $C_{1n}$. In the indexing of the filter coefficients, the first natural number is a tap position and the second is a cycle number. The accumulated sum at the filter cell 600 output is:

$$\Sigma_n = C_{4n}*d_n + C_{3n}*d_{n+1} + C_{2n}*d_{n+2} + C_{1n}*d_{n+3}$$

where $d_{n+3}$ is the data loaded into filter cell 600 in the previous cycle and $d_{n+2}$ is the data loaded into filter cell 600 a cycle before, and so on.

In the real mode of operation, a cycle time is equal to four clock periods. The coefficients are updated in a following order:

$$C_{4(n+1)} = C_{4n} + \mu*\xi*d_{n-2};$$

$$C_{3(n+1)} = C_{3n} + \mu*\xi*d_{n-1};$$

$$C_{2(n+1)} = C_{2n} + \mu*\xi*d_n;$$

$$C_{1(n+1)} = C_{1n} + \mu*\xi*d_{n+1};$$

The value $\xi$ in the above formulas is the filter error sign. In the real mode of operation, the update subtraction (UPD NEG) and product subtraction (PROD NEG) are set to 0, since only sums of products are involved in the above formulas. Update multiplexer 612 is controlled in such a way that data is constantly passed from register D2 to the multiplexer output. Data multiplexer 614 is controlled so that either D1 or D4 output data is passed to the multiplexer output. The sampling strobe signal (SYMSTB) is set low in one out of four clock periods. The accumulation strobe (ACCSTB) is set low one clock period before the sampling strobe.

The order of four taps filtering and the LMS coefficient update in the real mode of the cell operation is shown in TABLE 1, attached hereto in APPENDIX A.

In the complex mode, the 2-tap cycle is 8 clock periods long. The real part of data is applied to the data input of a filter during the first 4 clock periods and the imaginary part is applied during the remaining 4 clock periods. When the number of the cell operation cycle is n, the filter coefficients within a cycle are:

$$C_{2n}^R, C_{2n}^I, C_{1n}^R, C_{1n}^I$$

where R represents real coefficient portions and I represents imaginary coefficient portions. The real and imaginary portions of corresponding data are expressed as $d_n^R$ and $d_n^I$. The accumulated sums at the cell output are:

$$\Sigma_n^R = C_{2n}^R*d_{n+2}^R - C_{2n}^I*d_{n+2}^I + C_{1n}^R*d_{n+3}^R - C_{1n}^R*d_{n+3}^I;$$

$$\Sigma_n^I = C_{2n}^R*d_{n+2}^I + C_{2n}^I*C_{n+2}^R + C_{1n}^R*d_{n+3}^I + C_{1n}^I*d_{n+3}^R;$$

The LMS coefficient update equations are:

$$C_{2n}^R = C_{2(n-1)}^R + \mu*\xi^R*d_{n-1}^R - \mu*\xi^I*d_{n-1}^I;$$

$$C_{2n}^I = C_{2(n-1)}^I + \mu*\xi^R*d_{n-1}^I + \mu*\xi^I*d_{n-1}^R;$$

$$C_{1n}^R = C_{1(n-1)}^R + \mu*\xi^R*d_n^R - \mu*\xi^I*d_n^I;$$

$$C_{1n}^I = C_{1(n-1)}^I + \mu*\xi^R*d_n^I + \mu*\xi^I*d_n^R;$$

The real part of the Error Sign ($\xi^R$) signal appears at the input of the filter during four (4) clock periods of a cycle, and the imaginary part of the error sign ($\xi^I$) appears during the following (4) clock periods. In the formula for $\Sigma_n^R$, two products are subtracted from the sum of two products. For that reason, the product subtraction flag (PROD NEG) is set active for two out of eight clock periods within the cell operational cycle.

As can be seen from the LMS update equations, each coefficient is updated by two correction elements of a type $\mu^* \xi^* d_{n+1}$. In this embodiment of the current invention, the correction of four coefficients may be implemented within eight clock periods. During the first 4 clock periods of a cycle, each coefficient is updated by adding the first correction element. During the remaining 4 clock periods, each coefficient is updated by adding or subtracting a second correction element. This update order allows a single adder to be shared by the LMS update circuit. A more precise LMS update may be implemented in other embodiments of the current invention, using additional logic.

In the above LMS update equations, two out of eight correction elements are subtracted from the corresponding coefficients. For that reason, the update subtraction flag (UPDNEG) is set active for two out of eight clock periods within the cell operational cycle.

Data multiplexer 614 is controlled so that data from D1, D2, or D4 registers, or from the D4 register of a preceding (or prior) cell is passed to the multiplexer output. The update multiplexer is controlled in such a way that data from D1, D2, or D3 registers, or the D1 register of a subsequent (or next) cell is passed to the multiplexer output.

The sampling strobe (SYMSTB) signal is set low for one out of four clock periods. The accumulation strobe (ACCSTB) signal in the complex mode of the cell operation is set low one clock cycle before the sampling strobe signal. TABLE 2, attached hereto in APPENDIX B, shows the order of two tap filtering and the LMS coefficient update in the complex mode of the cell operation.

Each coefficient in TABLE 2 is loaded in register C4 and then in register C3, twice per the same cell operation cycle. However, in this embodiment, if coefficient $C_{1(n-1)}R$ is present in C3 during clock cycle 2 (see TABLE 2), it will appear in C3 a second time during clock cycle 6 already being partially updated with the first correction element. Therefore, some intermediate version between $c_{1(n-1)}^R$ and $c_{1n}^R$ is actually used in a second half of a cell operation cycle. However, the usage of these coefficients is not likely to have a significant influence on the filter performance. This assumption is based on the fact that LMS feedback coefficient $\mu$ is usually sufficiently small and the coefficients themselves are formed by the accumulated effect of the numerous LMS adaptation cycles.

Collectively, conditional minus one multiplier 620, multiplier 650, adder 655, accumulator register 660 and bus AND gate 665 comprise a product summation circuit that, when operating in the real mode, adds (or sums) a sequence of products formed by multiplying coefficients received from coefficient register 648 by data samples received from selected ones of data registers 601–604. In the complex mode of operation, the product summation circuit may selectively add or subtract individual products from the summation of products held in accumulator register 660, depending on the value of the PROD-NEG signal.

However, there are alternative methods for implementing the product summation circuit that also may selectively add or subtract individual products, depending on the mode of operation. In an alternate embodiment of digital filter 120, exemplary filter cell 500 and filter cell 600 may be further simplified by eliminating conditional minus one multiplier 520 and conditional minus one multiplier 620 and replacing adder 555 and adder 655, respectively, with adder-subtractor that are controlled by the product subtraction flag (or PROD_NEG) signal. For example, if conditional minus one multiplier 620 is eliminated in filter cell 600, the output of data multiplexer 614 would be applied to multiplier 650 and subsequently to adder-subtractor 655 (replacing adder 655) without being multiplied by minus one (−1) when the PROD_NEG signal is active. However, if the PROD_NEG signal is applied to adder-subtractor 655 to cause adder-subtractor 655 to subtract the output of multiplier 650 from the value received from bus AND gate 665, the same result will be received by accumulator register 660.

Similarly, filter cell 600 may be further simplified by eliminating conditional minus one multiplier 616 and replacing adder 641 with an adder-subtractor that is controlled by the output of Exclusive-OR gate 615. If conditional minus one multiplier 616 is eliminated in filter cell 600, the output of update multiplexer 612 (UPDT_OUT) would be applied in a preceding (or prior) filter cell to coefficient update circuit 644 and subsequently to adder-subtractor 641 (replacing adder 641) without being multiplied by minus one (−1) when the output of Exclusive-OR gate 615 is active. However, if the output of Exclusive-OR gate 615 is applied to adder-subtractor 641 to cause adder-subtractor 641 to subtract the output of barrel shifter 642 from the value received from coefficient register 633, the same result will be received by clip circuit 643 and coefficient register 634.

Figure 7:
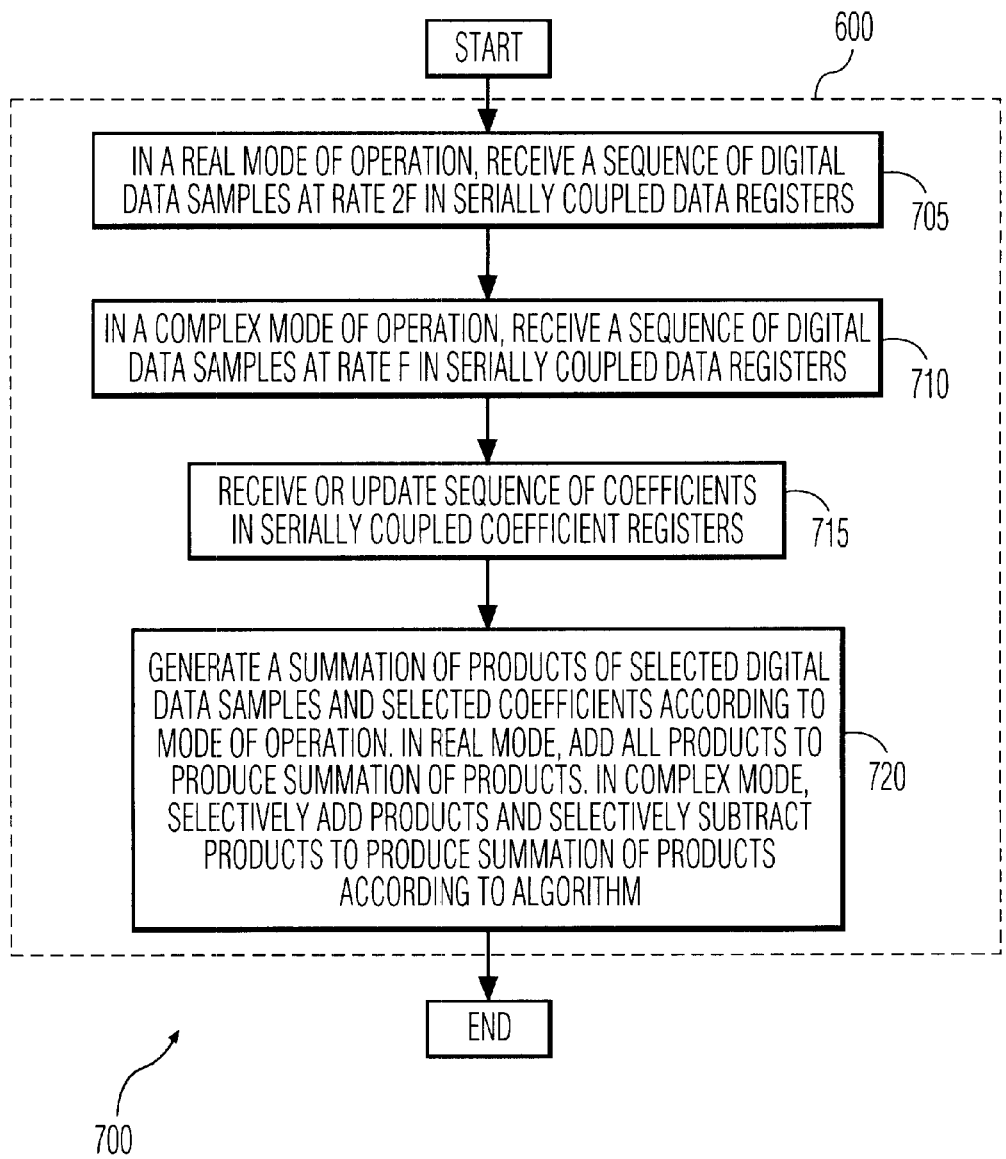
FIG. 7 is a flow chart illustrating the operation of a multimode digital filter cell in accordance with one embodiment of the present invention.

FIG. 7 depicts flow chart 700, which illustrates the operation of multimode digital filter cell 600 in accordance with one embodiment of the present invention. Initially, in a real mode of operation, filter cell 600 receives digital data samples at a rate of 2F into serially-coupled data registers 601–604 (process step 705). In a complex mode of operation, filter cell 600 receives digital data samples at a rate of 2F into serially-coupled data registers 601–604 (process step 710). Digital filter cell also receives or updates a sequence of coefficients in serially-coupled coefficient registers 631–634 (process step 715).

According to the mode of operation, filter cell 600 generates a summation of products in accumulator register 660 according to the algorithm implemented in digital filter 200, such as the summations of products in TABLE 1 and TABLE 2. For example, in a real mode of operation, filter cell 600 generates a sequence of products by multiplying selected coefficients in serially-coupled coefficient registers 631–634 by selected digital data samples in serially-coupled data registers 601–604. Filter cell 600 generates a summation of products in the real mode by adding the sequence of products to the value in accumulator register 660.

In a complex mode of operation, filter cell 600 generates a sequence of products by multiplying selected coefficients in serially-coupled coefficient registers 631–634 by selected digital data samples in serially-coupled data registers 601–604. Filter cell 600 generates a summation of products in the complex mode by selectively adding some products to the value in accumulator register 660 and by selectively subtracting some products from the value in accumulator register 660 (process step 720).

Although the present invention has been described in detail, those skilled in the art should understand that they can make various changes, substitutions and alterations herein without departing from the spirit and scope of the invention in its broadest form.

TABLE 1

APPENDIX A

| Clock Cycle | 0 | 1 | 2 | 3 | 4 | 5 |
|---|---|---|---|---|---|---|
| Multiplier Data Input | $d_n$ | $d_{n+1}$ | $d_{n+2}$ | $d_{n+3}$ | $d_{n+1}$ | $d_{n+2}$ |
| Multiplier Coefficient Input | $C_{4n}$ | $c_{3n}$ | $c_{2n}$ | $c_{1n}$ | $c_{4(n+1)}$ | $c_{3(n+1)}$ |
| Register C3 | $c_{3n-1}$ | $c_{2n-1}$ | $c_{1n-1}$ | $c_{4n}$ | $c_{3n}$ | $c_{2n}$ |
| Update From Following Cell | $D_{n-3}$ | $d_{n-2}$ | $d_{n-1}$ | $d_{n-3}$ | $d_{n-2}$ | $d_{n-1}$ |
| Cell Output | $\Sigma_{n-1}$ | $c_{4n}*d_n$ | $C_{4n}*d_n + c_{3n}*d_{n+1}$ | $c_{4n}*d_n + c_{3n}*d_{n+1} + c_{2n}*d_{n+2}$ | $c_{4n}*d_n + c_{3n}*d_{n+1} + c_{2n}*d_{n+2} + c_{1n}*d_{n+3}$ | $c_{4n+1}*d_{n+1}$ |

TABLE 2

APPENDIX B

| Clock Cycle | 0 | 1 | 2 | 3 | 4 | 5 |
|---|---|---|---|---|---|---|
| Multiplier Data Input | $d_n^R$ | $d_n^R$ | $-d_n^I$ | $d_{n+1}^R$ | $-d_{n+1}^I$ | $d_n^I$ |
| Multiplier Coefficient Input | $c_{1(n-3)}^I$ | $c_{2(n-2)}^R$ | $c_{2(n-2)}^I$ | $c_{1(n-2)}^R$ | $c_{1(n-2)}^I$ | $c_{2(n-2)}^R$ |
| Register C3 | $c_{2(n-3)}^R$ | $c_{2(n-3)}^I$ | $c_{1(n-3)}^R$ | $c_{1(n-3)}^I$ | $c_{2(n-3)}^R$ | $c_{2(n-3)}^I$ |
| Update From Following Cell | $d_{(n-3)}^R$ | $d_{(n-3)}^I$ | $d_{(n-2)}^R$ | $d_{(n-2)}^I$ | $d_{(n-3)}^R$ | $d_{(n-3)}^R$ |
| Cell Output | $c_{2(n-3)}^R*d_{n-1}^I + c_{2(n-3)}^I*d_{n-1}^R + c_{1(n-3)}^R*d_n^I$; | $c_{2(n-3)}^R*d_{n-1}^I + c_{2(n-3)}^I*d_{n-1}^R + c_{1(n-3)}^R*d_n^I + c_{1(n-3)}^I*d_n^R$; | $c_{2(n-2)}^R*d_n^R$; | $c_{2(n-2)}^R*d_n^R - c_{2(n-2)}^I*d_n^I$; | $c_{2(n-2)}^R*d_n^R - c_{2(n-2)}^I*d_n^I + c_{1(n-2)}^R*d_{(n+1)}^R$; | $c_{2(n-2)}^R*d_n^R - c_{2(n-2)}^I*d_n^I + c_{1(n-2)}^R*d_{n+1}^R - c_{1(n-2)}^I*d_{n+1}^I$; |

| Clock Cycle | 6 | 7 | 8 | 9 | 10 | 11 |
|---|---|---|---|---|---|---|
| Multiplier Data Input | $d_n^R$ | $d_{n+1}^I$ | $d_{n+1}^R$ | $d_{n+1}^R$ | $-d_{n+1}^I$ | $d_{n+2}^R$ |
| Multiplier Coefficient Input | $c_{2(n-2)}^I$ | $c_{1(n-2)}^R$ | $c_{1(n-2)}^I$ | $c_{2(n-1)}^R$ | $c_{2(n-1)}^I$ | $c_{1(n-1)}^R$ |
| Register C3 | $c_{1(n-3)}^R$ | $c_{1(n-3)}^I$ | $c_{1(n-2)}^R$ | $c_{2(n-2)}^I$ | $c_{2(n-2)}^R$ | $c_{1(n-2)}^I$ |
| Update From Following Cell | $d_{(n-2)}^I$ | $d_{(n-2)}^R$ | $d_{(n-2)}^R$ | $d_{(n-2)}^I$ | $d_{(n-1)}^R$ | $d_{(n-1)}^I$ |
| Cell Output | $c_{2(n-2)}^R*d_n^I$; | $c_{2(n-2)}^R*d_n^I + c_{2(n-2)}^I*d_n^R$; | $c_{2(n-2)}^R*d_n^I + c_{2(n-2)}^I*d_n^R + c_{1(n-2)}^R*d_{n+1}^I$; | $c_{2(n-2)}^R*d_n^I + c_{2(n-2)}^I*d_n^R + c_{1(n-2)}^R*d_{n+1}^I + c_{1(n-2)}^I*d_{n+1}^R$; | $c_{2(n-1)}^R*d_{n+1}^R$; | $c_{2(n-1)}^R*d_{n+1}^R - c_{2(n-1)}^I*d_{n+1}^I$; |

What is claimed is:

1. For use in a digital filter, a digital filter cell capable of processing in a first mode a first signal having real data components only and processing in a second mode a second signal having real data components and imaginary data components, said digital filter cell comprising:

a plurality of serially coupled coefficient registers capable of receiving a sequence of coefficients;

a plurality of serially coupled data registers capable of receiving a sequence of digital data samples, each of said serially coupled data registers having a tap output;

a data multiplexer having a plurality of input channels, each of said input channels capable of receiving said tap output from each of said plurality of serially coupled data registers; and a product summation circuit having a first input coupled to an output of said data multiplexer and a second input coupled to an output of a selected one of said plurality of serially coupled coefficient registers, wherein said product summation circuit is capable of generating a summation of a plurality of products formed by sequentially multiplying each coefficient received from said selected coefficient register by a corresponding digital data sample received from a selected one of said plurality of serially coupled data registers, wherein said product summation circuit adds each of said plurality of products to said summation when said digital filter cell is operating in said first mode and wherein said product summation circuit one of 1) selectively adds ones of said plurality of products to said summation and 2) selectively subtracts ones of said plurality of products from said summation when said digital filter cell is operating in said second mode.

2. The digital filter cell set forth in claim 1 wherein said product summation circuit comprises a conditional multiplier capable of selectively inverting a value of a data sample received from said data multiplexer, a multiplier, an adder and an accumulator register.

3. The digital filter cell set forth in claim 1 wherein said product summation circuit comprises a multiplier, an adder-subtractor, and an accumulator register.

4. The digital filter cell set forth in claim 1 wherein said first mode comprises an eight vestigial side band (8 VSB) mode of operation.

5. The digital filter cell set forth in claim 1 wherein said second mode of operation comprises a quadrature amplitude modulation (QAM) mode of operation.

6. The digital filter cell set forth in claim 1 wherein said real data in said first mode are sampled at a frequency of 2F and said real data components and imaginary data components in said second mode are sampled at a frequency of F.

7. The digital filter cell set forth in claim 1 wherein said digital filter is adaptive and said coefficients are modifiable.

8. The digital filter cell set forth in claim 7 further comprising a coefficient update circuit having a first input coupled to an output of a first selected one of said plurality of serially coupled coefficient registers, a second input coupled to a second digital filter cell in said digital filter, and an output coupled to an input of a second selected one of said plurality of serially coupled coefficient registers.

9. A television receiver comprising:
an RF demodulation circuit capable of down-converting a received RF input signal to one of a digitized baseband signal and a digitized intermediate frequency (IF) signal; and
a digital demodulation circuit capable of processing said one of a digitized baseband signal and a digitized intermediate frequency (IF) signal, wherein said digital demodulation circuit comprises a digital filter comprising a plurality of digital filter cells, wherein at least one of said plurality of digital filter cells is capable of processing in a first mode a first signal having real data components only and processing in a second mode a second signal having real data components and imaginary data components, said at least one digital filter cell comprising:
a plurality of serially coupled coefficient registers capable of receiving a sequence of coefficients;
a plurality of serially coupled data registers capable of receiving a sequence of digital data samples, each of said serially coupled data registers having a tap output;
a data multiplexer having a plurality of input channels, each of said input channels capable of receiving said tap output from each of said plurality of serially coupled data registers; and
a product summation circuit having a first input coupled to an output of said data multiplexer and a second input coupled to an output of a selected one of said plurality of serially coupled coefficient registers, wherein said product summation circuit adds each of said plurality of products to said summation when said digital filter cell is operating in said first mode and wherein said product summation circuit one of 1) selectively adds ones of said plurality of products to said summation and 2) selectively subtracts ones of said plurality of products from said summation when said digital filter cell is operating in said second mode.

10. The television receiver set forth in claim 9 wherein said product summation circuit comprises a conditional multiplier capable of selectively inverting a value of a data sample received from said data multiplexer, a multiplier, an adder and an accumulator register.

11. The television receiver set forth in claim 9 wherein said product summation circuit comprises a multiplier, an adder-subtractor, and an accumulator register.

12. The television receiver set forth in claim 9 wherein said first mode comprises an eight vestigial side band (8 VSB) mode of operation.

13. The television receiver set forth in claim 12 wherein said second mode of operation comprises a quadrature amplitude modulation (QAM) mode of operation.

14. The television receiver set forth in claim 9 wherein said real data in said first mode are sampled at a frequency of 2F and said real data components and imaginary data components in said second data mode are sampled at a frequency of F.

15. The television receiver set forth in claim 9 wherein said digital filter is adaptive and said coefficients are modifiable.

16. The television receiver set forth in claim 9 further comprising a coefficient update circuit having a first input coupled to an output of a first selected one of said plurality of serially coupled coefficient registers, a second input coupled to a second digital filter cell in said digital filter, and an output coupled to an input of a second selected one of said plurality of serially coupled coefficient registers.

17. For use in a digital filter cell, a method of filtering in a first mode a first digital signal having real data components only and filtering in a second mode a second digital signal having real data components and imaginary data components, the method comprising the steps of:
receiving a sequence of coefficients in a plurality of serially coupled coefficient registers in the digital filter cell;
receiving a sequence of digital data samples in a plurality of serially coupled data registers in the digital filter cell, each of the serially coupled data registers having a tap output;
generating a summation of a plurality of products formed by sequentially multiplying each coefficient received from a selected one of the serially coupled coefficient registers by a corresponding digital data sample received from a selected one of the plurality of serially coupled data registers, wherein the step of generating a summation comprises the substeps of:
adding each of the plurality of products to the summation when the digital filter cell is operating in the first mode; and
one of 1) selectively adding ones of the plurality of products to the summation and 2) selectively subtracting ones of the plurality of products from the summation when the digital filter cell is operating in the second mode.

18. The method set forth in claim 17 wherein the first mode comprises an 8 vestigial side band (8 VSB) mode of operation.

19. The method set forth in claim 18 wherein the second mode of operation comprises a quadrature amplitude modulation (QAM) mode of operation.

20. The method set forth in claim 17 wherein the digital filter is adaptive and the coefficients are modifiable.

21. The method set forth in claim 17 wherein the real data in the first mode are sampled at a frequency of 2F and the real data components and imaginary data components in the second data mode are sampled at a frequency of F.

22. A digital receiver comprising:

an input receiver circuit capable of converting a received input signal to one of a digitized baseband signal and a digitized intermediate frequency (IF) signal; and a digital demodulation circuit capable of processing said one of a digitized baseband signal and a digitized intermediate frequency (IF) signal, wherein said digital demodulation circuit comprises a digital filter comprising a plurality of digital filter cells, wherein at least one of said plurality of digital filter cells is capable of processing in a first mode a first signal having real data components only and processing in a second mode a second signal having real data components and imaginary data components, said at least one digital filter cell comprising:

a plurality of serially coupled coefficient registers capable of receiving a sequence of coefficients;

a plurality of serially coupled data registers capable of receiving a sequence of digital data samples, each of said serially coupled data registers having a tap output;

a data multiplexer having a plurality of input channels, each of said input channels capable of receiving said tap output from each of said plurality of serially coupled data registers; and a product summation circuit having a first input coupled to an output of said data multiplexer and a second input coupled to an output of a selected one of said plurality of serially coupled coefficient registers, wherein said product summation circuit is capable of generating a summation of a plurality of products formed by sequentially multiplying each coefficient received from said selected coefficient register by a corresponding digital data sample received from a selected one of said plurality of serially coupled data registers, wherein said product summation circuit adds each of said plurality of products to said summation when said digital filter cell is operating in said first mode and wherein said product summation circuit one of 1) selectively adds ones of said plurality of products to said summation and 2) selectively subtracts ones of said plurality of products from said summation when said digital filter cell is operating in said second mode.

23. The digital receiver set forth in claim 22 wherein said product summation circuit comprises a conditional multiplier capable of selectively inverting a value of a data sample received from said data multiplexer, a multiplier, an adder and an accumulator register.

24. The digital receiver set forth in claim 22 wherein said product summation circuit comprises a multiplier, an adder-subtractor, and an accumulator register.

25. The digital receiver set forth in claim 22 wherein said first mode comprises an eight vestigial side band (8 VSB) mode of operation.

26. The digital receiver set forth in claim 25 wherein said second mode of operation comprises a quadrature amplitude modulation (QAM) mode of operation.

27. The digital receiver set forth in claim 22 wherein said real data in said first mode are sampled at a frequency of 2F and said real data components and imaginary data components in said second data mode are sampled at a frequency of F.

28. The digital receiver set forth in claim 22 wherein said digital filter is adaptive and said coefficients are modifiable.

29. The digital receiver set forth in claim 22 further comprising a coefficient update circuit having a first input coupled to an output of a first selected one of said plurality of serially coupled coefficient registers, a second input coupled to a second digital filter cell in said digital filter, and an output coupled to an input of a second selected one of said plurality of serially coupled coefficient registers.

* * * * *